United States Patent [19]

Cabot et al.

[11] 4,344,029
[45] Aug. 10, 1982

[54] AUTOMATIC IM DISTORTION TEST SELECTOR

[75] Inventors: Richard C. Cabot; Bruce E. Hofer, both of Beaverton, Oreg.

[73] Assignee: Tektronix, Inc., Beaverton, Oreg.

[21] Appl. No.: 262,107

[22] Filed: May 11, 1981

Related U.S. Application Data

[63] Continuation of Ser. No. 139,939, Apr. 11, 1980.

[51] Int. Cl.³ .............................. G01R 27/00
[52] U.S. Cl. .................................. 324/57 R
[58] Field of Search ............ 324/57 R, 57 DE, 57 N; 328/163, 138, 137, 141; 455/50, 63, 67, 296; 358/10

[56] References Cited

U.S. PATENT DOCUMENTS

| | | | |
|---|---|---|---|
| 2,607,007 | 8/1952 | Clark | 328/137 X |
| 2,767,373 | 10/1956 | Maggio | 324/57 DE |
| 2,970,258 | 1/1961 | Sinclair | 324/57 DE |
| 3,777,256 | 12/1973 | Harrison | 324/57 DE |
| 3,962,645 | 6/1976 | Stewart | 328/138 X |

OTHER PUBLICATIONS

Hiscocks, DISTORTION Some Simple Ways to Measure It, Audio Scene Canada, Jul. 1974, pp. 18-21.

Primary Examiner—Stanley T. Krawczewicz
Attorney, Agent, or Firm—William D. Haffner

[57] ABSTRACT

An intermodulation test analyzer which automatically determines whether an SMPTE or CCIF intermodulation test is being conducted and switches its output accordingly is disclosed. This is accomplished by sensing the low frequency energy content of the test signal. This energy content is compared to a reference level representative of the low frequency energy content of a typical SMPTE test signal. Therefore, if the low frequency energy content of the input signal is greater than the reference level, the signal is treated as the SMPTE test signal. However, if the low frequency energy content is less than the reference level, the signal is processed as a CCIF test signal.

16 Claims, 3 Drawing Figures

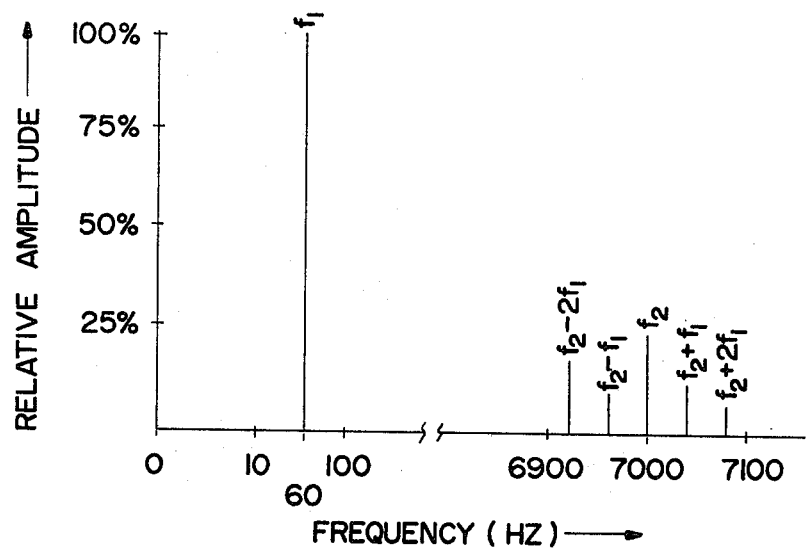
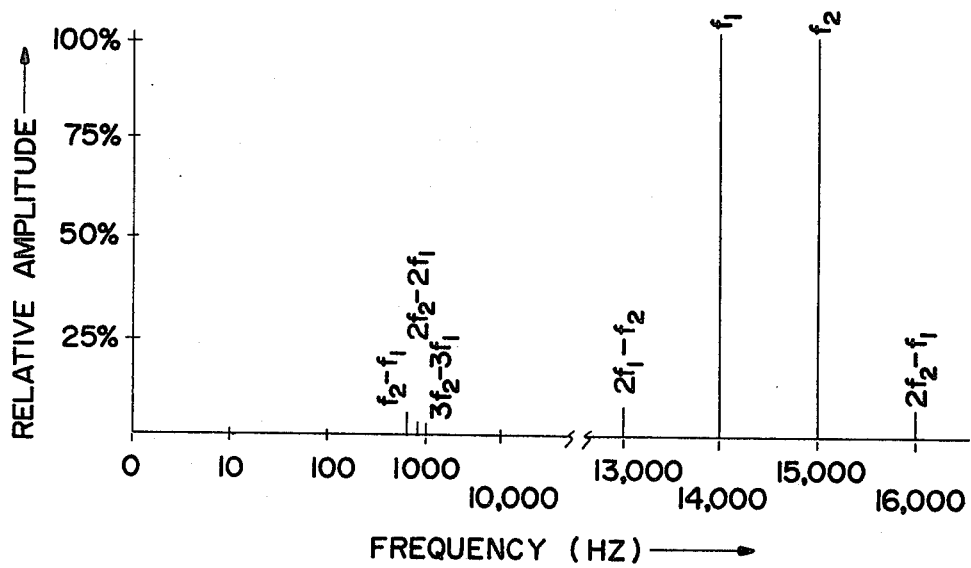
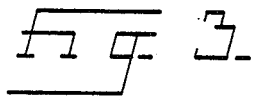

AUTOMATIC IM DISTORTION TEST SELECTOR

This is a continuation of application Ser. No. 139,939, filed Apr. 11, 1980.

BACKGROUND OF THE INVENTION

This invention relates to an apparatus for measuring intermodulation distortion and particularly to an intermodulation analyzer which automatically switches its output depending upon the type of intermodulation distortion test being conducted.

Intermodulation may be defined as: The production in a nonlinear circuit element of frequencies corresponding to the sum and differences of the fundamentals and harmonics of two or more frequencies which are transmitted through the element. Thus, when two frequencies are applied to the input of an audio frequency device, not only do the fundamental frequencies appear in the output but also sum and difference frequencies which are, as a rule, not harmonically related to the fundamental frequencies.

Several techniques and various instruments have been developed to measure intermodulation distortion. Two of the more widely used tests are the SMPTE (Society of Motion Picture and Television Engineers) and the CCIF (International Telephonic Consulative Committee) tests.

The SMPTE test appears to have been introduced in the United States by Frayne and Scoville (see Frayne, J. G. and Scoville R. R., "Analysis and Measurement of Distortion in Variable-Density Recording", J.S.M.P.T.E., 32 (June, 1939) pp. 648-673) who considered the evaluation of distortion in variable density sound-on-film recording. The test signal utilized in the SMPTE test is a low frequency (between 40 Hz and 100 Hz) and a high frequency (between 1000 Hz and 12,000 Hz) tone, summed together in a 4 to 1 amplitude ratio. Other amplitude ratios are occasionally used.

The CCIF test which was introduced in 1933 by von Braunmuhl and Weber (see von Braunmuhl, H. J. and Weber, W., "Nichtlineare Verzerrungen von Mikrophonen", *Elektrotechnische Zeitschrift*, Vol. 54 (Nov., 1933)) differs from the SMPTE test in that a pair of equal-amplitude signals closely spaced in frequency are applied to the device under test. The nonlinearity in the device under test causes intermodulation products between the two signals which are subsequently measured. For the typical case of input signals at 14 kHz and 15 kHz, the intermodulation components are at 1 khz, 2 kHz, 3 khz, etc. and 13 kHz, 16 kHz, 12 kHz, etc. Even order or asymmetrical distortions produce the low frequency components while odd order or symmetrical distortions produce the frequency components near the input signals. Typically only the even order frequency components are measured.

Instruments have been designed which perform both the SMPTE and CCIF intermodulation tests. These analyzers, however, require an operator to manually switch between the two tests.

SUMMARY OF THE INVENTION

According to the present invention an apparatus is provided which determines if an SMPTE or CCIF intermodulation test signal is present and switches the output circuitry of a distortion analyzer to an appropriate mode. The SMPTE test method utilizes a low frequency and a high frequency tone. Nonlinear distortion in the equipment being tested results in sidebands on the high frequency tone. The CCIF test method utilizes two high frequency tones such that nonlinear distortion will result in a signal at the difference between the two frequencies.

If the frequency spectra of the SMPTE and CCIF test signals are analyzed it can be seen that a significant amount of low frequency energy is always present in the SMPTE signal. However, the only situation in which a significant amount of low frequency energy is present in the CCIF signal is when it is grossly distorted (greater than 30 percent or −10 dB). Therefore, the distortion measurements are limited to below 30 percent and the low frequency energy is measured and compared to a reference value. If the low frequency energy content is greater than the reference level it is assumed to be an SMPTE test, otherwise it is assumed to be a CCIF test. The comparison is made by a comparator which drives a switching means in order to switch the output circuits of the distortion analyzer.

It is therefore a primary object of the present invention to provide a distortion analyzer which automatically determines whether an SMPTE or CCIF intermodulation distortion test signal is present at its input.

It is another object of the present invention to provide an apparatus which switches the output of an intermodulation distortion analyzer dependent upon the type of input signal.

The foregoing and numerous other objects, advantages, and inherent functions of the present invention will become apparent as the same is more fully understood from the following description. It is to be understood, however, that the embodiment described is not intended to be exhausting nor limiting of the invention and is presented as an example only.

BRIEF DESCRIPTION OF THE DRAWINGS

In the drawings:

FIG. 2 is a partial frequency spectrum of the SMPTE test signal as it might appear on the display of a spectrum analyzer; and FIG. 3 is a partial frequency of the CCIF test signal as it might appear on the display of a spectrum analyzer.

DETAILED DESCRIPTION OF THE PREFERRED EMBODIMENT

Figure 1:
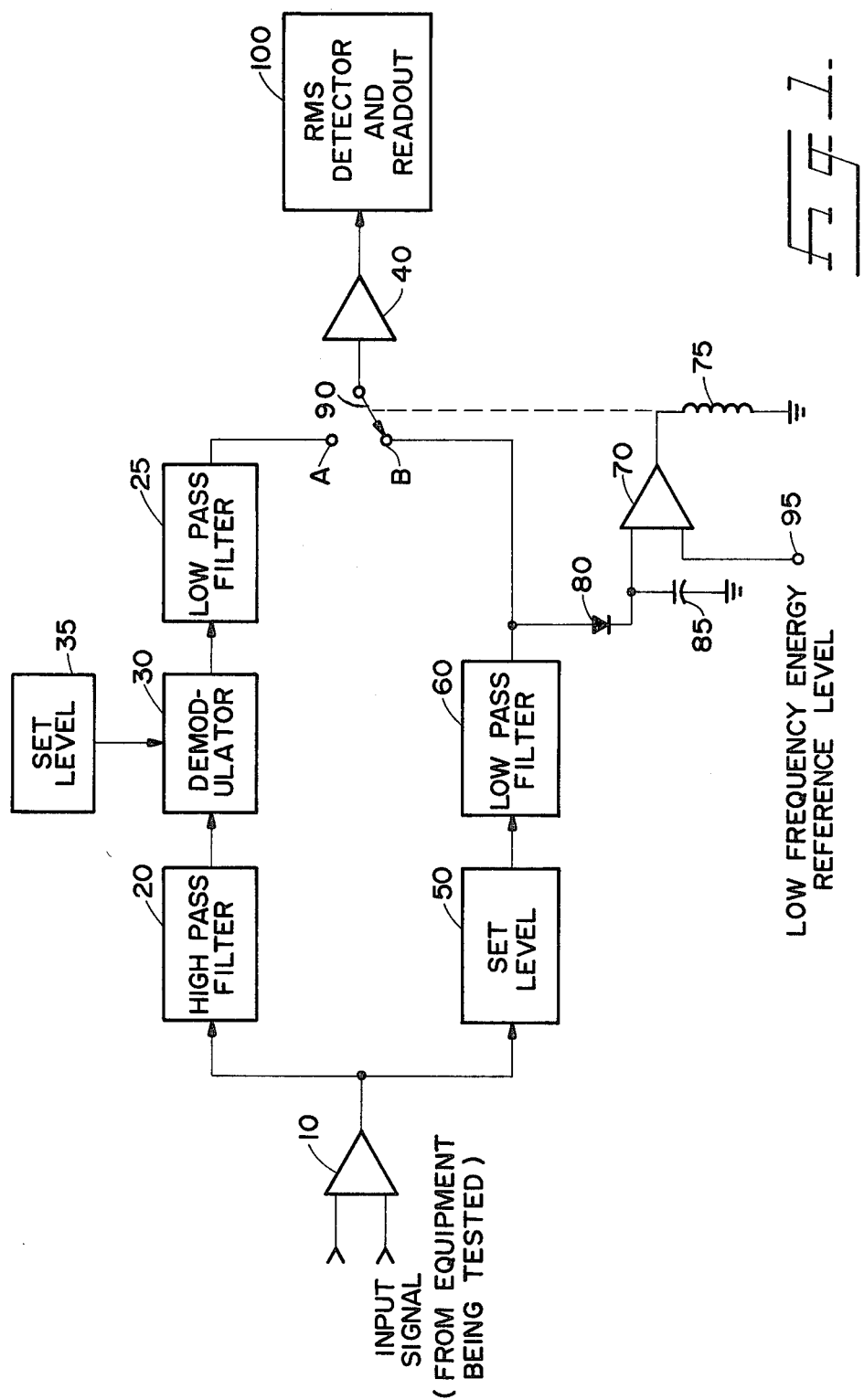
FIG. 1 is a block diagram of a preferred embodiment of the present invention.

Referring now to the drawings, FIG. 1 is a block diagram of an intermodulation analyzer according to the present invention.

The input signal to the intermodulation analyzer of FIG. 1 is the output signal from the equipment under test. That is, the input signal is the result of passing either the SMPTE or CCIF test signal through the equipment under test. The input signal is first coupled to input amplifier 10. The single-ended output signal of amplifier 10 is routed in two separate directions.

One path the output of amplifier 10 takes is to demodulator 30 via high pass filter 20. The carrier level of the demodulated signal is set by set level circuit 35. Set level circuit 35 may be a conventional manual adjustment (e.g., a potentiometer) or an automatic control circuit such as that described in U.S. application Ser. No. 139,940, "Automatic Intermodulation Distortion Analyzer" filed Apr. 11, 1980, by R. C. Cabot, which is incorporated herein by reference. The demodulated signal is coupled to low pass filter 25. The above-described elements (20, 30, 35, and 25) comprise an SMPTE intermodulation analyzer.

The other path the output of amplifier 10 takes is to low pass filter 60 via set level circuit 50. Set level circuit 50 may be any conventional level control circuit. These elements, 50 and 60, comprise a CCIF intermodulation analyzer.

The output of low pass filter 60 is coupled to pole B of double-pole, single-throw switch 90 and the output of low pass filter 25 is coupled to pole A of switch 90. Switch 90 may be an electronic switch (e.g., a transistor or CMOS switch), a relay as depicted in FIG. 1, or some other equivalent switching means. In addition to being coupled to pole B of switch 90, the output of low pass filter 60 is also coupled to one input of a comparator 70 via rectifier 80. A filter capacitor 85 is connected between the comparator input and ground. The other input to comparator 70 is an external reference level to which the output of low pass filter 60 is compared. If the output of low pass filter 60 is less than the reference signal, switch 90 (via coil 75) connects the output of low pass filter 60 to distortion amplifier 40. However, if the output of filter 60 is greater than the reference signal, switch 90 connects the output of low pass filter 25 to distortion amplifier 40. The amplified distortion component is then fed to RMS detector and readout 100 where the RMS value of the distortion is measured and displayed in a conventional manner. The distortion may be displayed as a percentage or dB reading.

Before proceeding with a description of the operation of the present invention, a brief description of the frequencies involved in the SMPTE and CCIF tests may be helpful. For two frequencies $f_1$ and $f_2$, the intermodulation products will consist of second-order terms $(f_1+f_2)$ and $(f_1-f_2)$; third order terms $(2f_1+f_2)$, $(2f_1-f_2)$, $(f_1+2f_2)$, and $(f_1-2f_2)$; and so on for the higher sum and difference frequencies.

FIG. 2 shows a portion of the frequency spectrum as it appears at the input of amplifier 10 when the SMPTE test signal is applied to the equipment under test. Fundamental frequencies of 60 Hz and 7000 Hz are used for purposes of illustration only. The others are the sum and difference frequencies generated within the equipment under test. It will be noted that the lower fundamental frequency $f_1$ is taken as 100-percent amplitude and all other frequencies are plotted relative to this frequency. The amplitude of fundamental frequency $f_2$ is 12 dB lower which corresponds to the 25-percent amplitude level. This is the previously-mentioned 4 to 1 amplitude ratio. The amplitude of the sum and difference frequencies is dependent upon the amount of intermodulation distortion present in the equipment being tested. The percentage of intermodulation is referenced to the amplitude of the high frequency signal. Other frequencies above and below $f_2$ will be produced but have been omitted from FIG. 2 for clarity.

The CCIF test uses two fundamental frequencies, $f_1$ and $f_2$, as in the SMPTE test; however, $f_1$ and $f_2$ are of equal amplitude with a difference in frequency somewhere between 30 and 1000 Hz. Intermodulation products are generated in the equipment being tested between each fundamental frequency and the second harmonic of the other fundamental frequency. FIG. 3 shows a portion of the frequency spectrum as it appears at the input of amplifier 10 when the CCIF test signal is applied to the equipment under test. Fundamental frequencies of 14,000 and 15,000 are utilized for purposes of illustration only. The frequencies shown are the sum and difference frequencies developed by the equipment being tested. It can be seen that $f_1$ and $f_2$ are both at 100-percent amplitude levels. The amplitude of the other frequencies depend upon the amount of intermodulation distortion present in the equipment being tested.

By comparing the spectra of the SMPTE and CCIF test signal, it can be seen that there will always be a significant amount of low frequency energy (less than 10,000 Hz, for example) present in the SMPTE test signals. The only time a significant amount of low frequency energy will be present in CCIF spectrum would be when there is gross distortion in the equipment being tested. Therefore, if the CCIF portion of the analyzer is never required to measure distortion greater than approximately 30 percent or $-10$ dB, the low frequency energy may be detected and compared to a reference as shown in FIG. 1.

By way of operation then, the output signal from the equipment being tested is amplified to a predetermined level by amplifier 10 before being fed to both an SMPTE analyzer and an CCIF analyzer. The SMPTE analyzer comprises high pass filter 20, demodulator 30, set level circuit 35 and low pass filter 25. In order to measure the intermodulation products caused by the SMPTE signal, the original low frequency signal component $f_1$ must be removed. This is accomplished in high pass filter 20. The output of filter 20 consists of what may be termed the carrier and its resultant sidebands. This carrier is then demodulated by demodulator 30. The carrier level is automatically or manually adjusted to provide a 100-percent carrier level. This makes the analyzer direct reading in percent modulation. The output of the demodulator is transmitted through low pass filter 25 which removes the carrier and transmits the modulating envelope to rms detector and readout 100 via distortion amplifier 40 if switch 90 is in the A position.

The CCIF analyzer comprises set level circuit 50 and low pass filter 60. Set level circuit 50 adjusts the input signal so that the amplitude of the fundamental frequencies is at 100 percent thus enabling a direct reading of percent of modulation. The signal is low pass filtered by filter 60 and fed to rms detector and readout 100 via distortion amplifier 40 when switch 90 is in the B position.

The output of filter 60, which is essentially the low difference frequency components produced by even order asymmetrical distortions in the equipment being tested, is also rectified by diode 80, filtered by capacitor 85 and coupled to an input of comparator 70. The other input to comparator 70 is a reference level 95 representative of the typical low frequency energy content of an SMPTE intermodulation test signal. If the signal from low pass filter 60 is less than reference level 95, the output of comparator 70 causes switching means 90, via coil 75, to change to the B position and thereby switch the output of low pass filter 60 to the input of distortion amplifier 40. However, if the signal from low pass filter 60 is greater than reference level 95, the output of comparator 70 causes switching means 90, via coil 75, to change to the A position thereby switching the output of low pass filter 25 to the input of distortion amplifier 40. Amplifier 40 then amplifies the distortion signal before it is measured by an rms detector and displayed on the readout. This meter may be calibrated in percent of modulation or dB. The use of an average reading detector rather than an rms detector may be acceptable in some instances.

From the foregoing it will be seen that the applicants have provided a new and novel apparatus for automating the selection of output circuitry in dual test intermodulation analyzer. However, it may be observed that the foregoing specification has not been burdened by the inclusion of large amounts of detail and specific information relative to such matters as timing and biasing since they are believed to be within the skill of the art. It should be noted that the particular embodiment of the invention which is shown and described herein is intended to be illustrative and not restrictive of the invention. Therefore, the appended claims are intended to cover all modifications which fall within the scope of the foregoing specification.

We claim as our invention:

1. Apparatus for measuring distortion produced by electrical circuitry to which one of a plurality of different distortion test signals is applied, comprising
   a plurality of distortion analyzers coupled to receive an output signal from the circuitry under test, each of said analyzers being configured for processing of a different one of said plurality of distortion test signals,
   means coupled to the output of one distortion analyzer for determining the presence of a certain one of said test signals, and
   means for switching the outputs of said analyzers in response to a determination that said certain test signal is present.

2. The apparatus of claim 1, wherein said determining means includes means for detecting the presence of test signal frequency components characteristic of one of said plurality of distortion test signals.

3. The apparatus of claim 2, wherein said determining means further includes means for comparing the energy content of an output signal from said one distortion analyzer with a predetermined energy reference level.

4. The apparatus of claim 1, further comprising means coupled via said switching means to said distortion analyzers for indicating a measured level of distortion.

5. The apparatus of claim 1, wherein said distortion analyzers are configured for processing different standardized intermodulation test signals.

6. The apparatus of claim 5, wherein said intermodulation test signals include the SMPTE and CCIF intermodulation test signals.

7. Apparatus for measuring intermodulation distortion produced by electronic circuitry to which one of a pair of different distortion test signals is applied, one of said signals having a frequency characteristic not present in the other, comprising
   a pair of intermodulation distortion analyzers coupled to receive an output signal from circuitry to which one of said test signals has been applied, each of said analyzers being configured for processing a different one of said pair of test signals,
   means coupled to the output of one distortion analyzer for determining the presence of said frequency characteristic, and
   means for switching between the outputs of said analyzers in response to a determination that said frequency characteristic is present at the output of said one analyzer.

8. The apparatus of claim 7, wherein said determining means includes means for comparing signals output from said one analyzer with a reference level functionally related to said frequency characteristic.

9. The apparatus of claim 7, further comprising means for indicating a measured level of intermodulation distortion produced by said circuitry under test, said indicating means being coupled via said switching means to the outputs of said distortion analyzers.

10. The apparatus of claim 7, wherein one distortion analyzer is configured to process a first test signal having a low frequency component, and the other distortion analyzer is configured to process a second test signal devoid of low frequency components.

11. The apparatus of claim 10, wherein said determining means is coupled to the output of said other analyzer for determining the presence of the low frequency component of said first test signal.

12. The apparatus of claim 10, wherein said first test signal is an SMPTE test signal and said second test signal is an CCIF test signal.

13. Apparatus for determining the amount of intermodulation distortion produced by electrical circuitry to which one of a pair of different distortion test signals is applied, one of said test signals having a frequency component not present in the other signal, comprising
   first and second analyzers coupled to receive an output signal from circuitry to which said one of said test signals has been applied, said first analyzer being configured to process a signal that includes said frequency component, said second analyzer being configured to process a signal that is devoid of said frequency component,
   output circuitry for measuring the distortion content of signals processed by said first and second analyzers,
   means coupled to one of said first and second analyzers for making a determination of whether said frequency component is present in the output thereof, and
   means for switching said output circuitry between said first and second analyzers on the basis of said determination.

14. The apparatus of claim 13, wherein said first analyzer is configured to process an intermodulation test signal having a low frequency component, and said second analyzer is configured to process an intermodulation test signal devoid of low frequency components, and wherein said output circuitry is switched from one analyzer to the other when said low frequency component is determined to be present at the output of said one analyzer.

15. The apparatus of claim 14, wherein said determination means comprises means for comparing the low frequency energy content of signals output from said one analyzer with a predetermined reference level.

16. The apparatus of claim 15, wherein said first analyzer is configured to process an SMPTE intermodulation test signal and send second analyzer is configured to process an CCIF intermodulation test signal.

* * * * *